(12) United States Patent
Jang

(10) Patent No.: US 11,312,870 B2
(45) Date of Patent: Apr. 26, 2022

(54) COPPER BASED CONDUCTIVE PASTE AND ITS PREPARATION METHOD

(71) Applicant: SEOUL NATIONAL UNIVERSITY R&DB FOUNDATION, Seoul (KR)

(72) Inventor: Jyongsik Jang, Seoul (KR)

(73) Assignee: SEOUL NATIONAL UNIVERSITY R&DB FOUNDATION

( * ) Notice: Subject to any disclaimer, the term of this patent is extended or adjusted under 35 U.S.C. 154(b) by 473 days.

(21) Appl. No.: 16/340,101

(22) PCT Filed: Feb. 22, 2019

(86) PCT No.: PCT/KR2019/002214
§ 371 (c)(1),
(2) Date: Apr. 5, 2019

(87) PCT Pub. No.: WO2019/198929
PCT Pub. Date: Oct. 17, 2019

(65) Prior Publication Data
US 2021/0324208 A1    Oct. 21, 2021

(30) Foreign Application Priority Data

Apr. 12, 2018  (KR) .................. 10-2018-0042720

(51) Int. Cl.
*C09D 5/24* (2006.01)
*C09D 7/65* (2018.01)
(Continued)

(52) U.S. Cl.
CPC ................ *C09D 5/24* (2013.01); *C09D 7/20* (2018.01); *C09D 7/62* (2018.01); *C09D 7/63* (2018.01);
(Continued)

(58) Field of Classification Search
CPC .......... C09D 11/02; C09D 11/30; C09D 11/52
See application file for complete search history.

(56) References Cited

U.S. PATENT DOCUMENTS

2016/0160359 A1    6/2016  Jang et al.

FOREIGN PATENT DOCUMENTS

| CN | 101507885 A | 8/2009 |
| CN | 104485154 A | 4/2015 |

(Continued)

*Primary Examiner* — Khanh T Nguyen
(74) *Attorney, Agent, or Firm* — Renaissance IP Law Group LLP

(57) ABSTRACT

The present inventive concept relates to a copper based conductive paste and its preparation method. The copper based conductive paste comprises a copolymer-copper composite comprising an imidazole-silane copolymer with partially cross-linked structure and a copper powder, a solvent, a binder and an additive. The imidazole-silane copolymer with partially cross-linked structure is introduced into the copper powder whose surface is treated by a hydrochloric acid aqueous solution and a phosphoric acid aqueous solution. The imidazole-silane copolymer is polymerized by using an imidazole monomer represented by following formula 1, a silane monomer represented by following formula 2 and a cross-linking agent.

[Formula 1]

(Continued)

Figure 1:
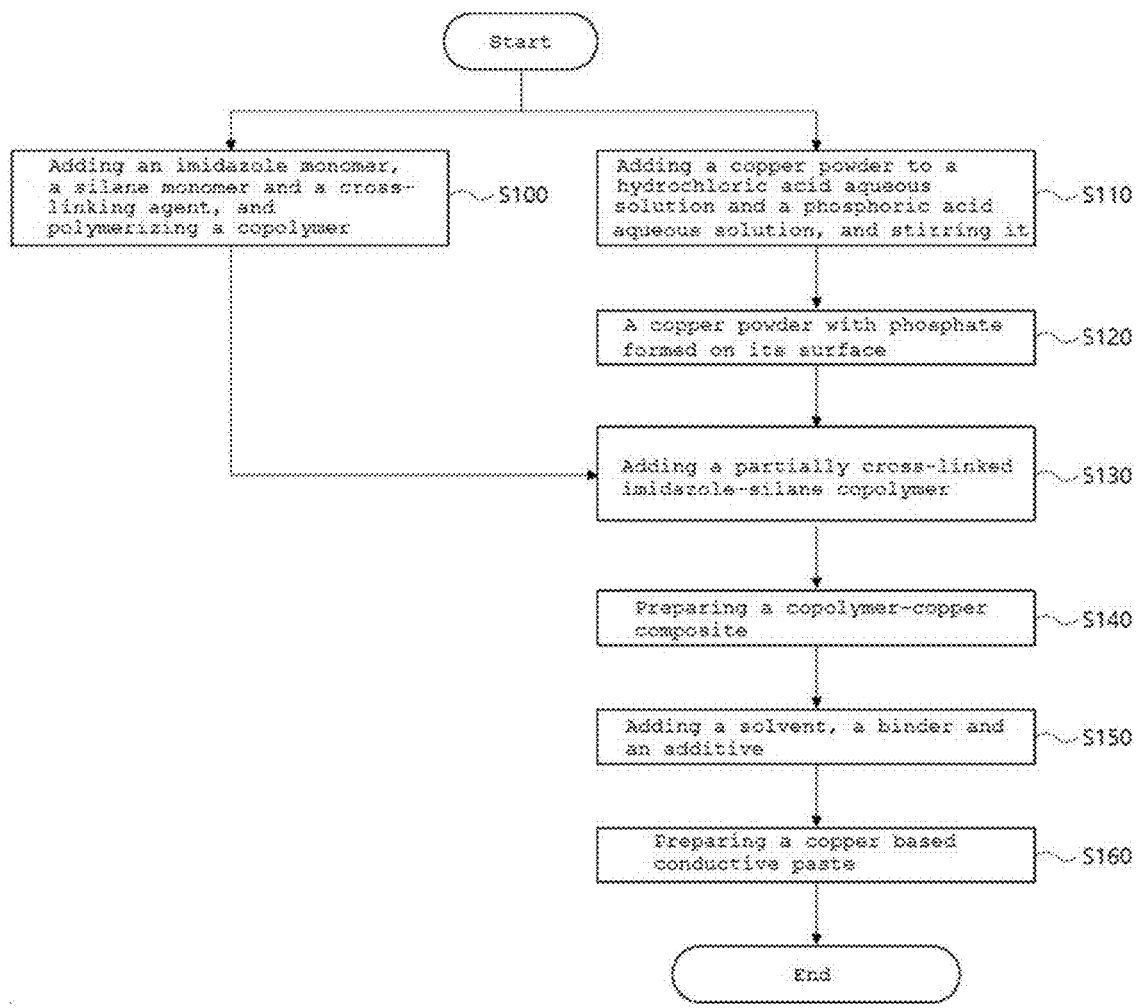

In Formula 1, X represents a hydrogen atom (H) or a methyl group (—$CH_3$), and $R_1$ represents a vinyl group or an allyl group.

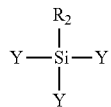

[Formula 2]

In Formula 2, Y represents a methoxy group, a 2-methoxy ethoxy group or an acetoxy group, and $R_2$ represents a vinyl group.

27 Claims, 2 Drawing Sheets

(51) Int. Cl.
*C09D 7/40* (2018.01)
*C09D 7/20* (2018.01)
*C09D 7/63* (2018.01)
*C09D 7/62* (2018.01)
*C09D 125/18* (2006.01)

(52) U.S. Cl.
CPC ................ *C09D 7/65* (2018.01); *C09D 7/69* (2018.01); *C09D 7/70* (2018.01); *C09D 125/18* (2013.01)

(56) References Cited

FOREIGN PATENT DOCUMENTS

| JP | 2011216475 A | 10/2011 |
| JP | 2013500571 A | 1/2013 |
| JP | 2013143368 A | 7/2013 |
| JP | 2015090899 A | 5/2015 |
| JP | 2016147844 A | 8/2016 |
| KR | 20100123131 A | 11/2010 |
| KR | 20150056963 A | 5/2015 |

COPPER BASED CONDUCTIVE PASTE AND ITS PREPARATION METHOD

TECHNICAL FIELD

The present disclosure relates to a copper based conductive paste and its preparation method. More particularly, the present disclosure provides a copper based conductive paste and its preparation method which can replace the existing curing type conductive paste and be used in various fields by treating a surface of a copper powder with partially crosslinked imidazole-silane copolymer in order to prevent oxidation of the copper powder and provide thermal stability and mixing the treated copper powder with a binder resin dissolved in a water-based solvent or an oil-based solvent to form a conductive paste.

BACKGROUND ART

The technical advantage of printed electronics is presently being magnified, and thus a conductive paste that is the core material of printed electronics has been studied in various ways. The conductive paste is prepared by dispersing various conductive filler in a binder resin dissolved in a solvent, and is composed of a curing agent, a curing catalyst and an additive as well as conductive filler, a solvent, a binder resin.

As examples of the conductive filler that is added to this conductive paste to give conductivity, there are carbon-based compounds such as carbon black and graphite, various metal powders such as gold, silver, copper, nickel, aluminum and the like, and substances prepared by treating the surface of various non-conductive particulate materials or short fiber with a conductive metal such as silver. In general, since the carbon-based compounds have a lower conductivity than that of the conductive metal, its application is limited. In the case of conductive metals, there is little difference in the conductivity of the bulk materials. However, when used as the filler of a conductive paste, the range of use of each conductive metal is different due to factors such as processability in making powders of metals, surface oxidation, costs, and so on.

A metal paste which is a typical conductive paste, is a conductive material made by mixing metal filler such as gold, silver, aluminum, nickel and the like with a binder resin dissolved in solvent to make it a paste state. The metal paste is applicable to various fields including a solar cell. The metal paste is in a state where metal powders are dispersed in a binder resin solution with fluidity and can be applied to various electrodes, display, nano ink and smartphone antenna.

As the kind of metal pastes, there are silver (Ag) paste, conductive paste, high temperature paste and anisotropic conductive paste. The silver (Ag) paste is a conductive material with the most widely used silver powders as filler. The conductive paste is used for printed circuit boards or electromagnetic shielding. The high temperature paste is used for condenser electrodes or resistance networks. The anisotropic conductive past is used for liquid crystal display (LCD), etc. The silver (Ag) powder is highly conductive and highly reliable filler, and is typical metal filler. The silver (Ag) powder has excellent oxidation resistance so that even a small powder of 0.1 to 1 micrometer is very stable to oxidation and a post process such as a change to flakes is available.

In the case of a high molecule type conductive paste using a binder resin, the conductivity depends on contact between fillers, and thus it is necessary to increase the contact area between fillers in the paste. The Silver (Ag) paste where silver flake is used as filler has very high conductivity with surface resistance of $10^{-4} \Omega/\square$ (ohm per square) so that it is widely used in various fields.

However, the conductive paste using the silver powder is expensive in comparison with the metal paste prepared by using other metal materials, and its application is limited. Accordingly, a copper (Cu) paste as a metal paste that can replace the silver paste has been attracting attention. Copper (Cu) is much more advantageous in price than silver (Ag) and has conductivity similar to that of silver (Ag) so that its application increases rapidly.

However, there is the disadvantage that copper (Cu) is easily oxidized in comparison with silver (Ag) or other metals. When a copper paste is placed in the air after using the copper paste as electronic materials, oxygen contained in the air or oxygen contained in the binder resin combines with the copper material to oxidize the surface of the copper particles. As a result, the conductivity of the copper paste decreases rapidly and it loses function as electronic materials. To overcome these problems, silver-coated copper (Cu) paste has been developed recently. This conductive paste is cheaper than silver (Ag) paste and can be used for electrode and electromagnetic shielding. Since the material of silver-coated copper (Cu) is manufactured by coating the surface of copper (Cu) with a thin film of silver (Ag), it can compensate the existing defect of copper that copper is oxidized when it is exposed to air or high temperature (200) for a long time at room temperature. However, there is still the disadvantage that it is expensive in comparison with copper (Cu).

Therefore, the research of inhibiting corrosion by carrying out surface treatment for copper (Cu) powders with an organic polymer compound has been continuously done. As a method for solving the corrosion problem, there are many methods such as a method of forming an anticorrosion coating layer on the surface of copper (Cu) powders by adding an organic corrosion inhibitor. There are various imidazole compounds as typical corrosion inhibitors. Oxidation of the copper (Cu) powder surface can be effectively prevented by using a surface treatment agent containing an imidazole compound such as 2-alkylimidazole, 2-arylimidazole, 2-alkylbenzimidazole, 2-aralkylbenzimidazole and 2-aralkylimidazole, etc. However, serious heat history is generated in the heat treatment process of 150° C. or more to promote the formation of the oxide film on the surface of the copper (Cu) powder so that the conductivity is drastically lowered.

Further, in the case of copper (Cu) paste, copper powders must be uniformly distributed in the binder resin in order to maintain excellent conductivity. In the case of existing copper (Cu) paste, since the dispersibility of copper (Cu) powders in the binder resin is low when blended, there is a problem that corrosion occurs through regions where dispersibility of copper (Cu) powders is low after applying it as electronic materials.

DISCLOSURE

Technical Problem

In order to solve the above mentioned problems, the present inventive concept provides a copper based conductive paste with excellent properties.

The present inventive concept provides a copper based conductive paste with corrosion resistance and heat resistance by introducing a partially cross-linked imidazole-silane copolymer into a copper powder to form an anti-corrosive coating layer.

The present inventive concept provides a preparation method of the copper based conductive paste.

After many experiments and intensive studies, the inventors of the present inventive concept have found a method completely different from known methods. In this method, a copper paste based on oil-based and water-based binder is prepared by introducing a partially cross-liked imidazole-silane copolymer into the anti-corrosive layer of a copper powder.

The other objects of the present inventive concept will be clearly understood with reference to the following detailed description and the accompanying drawings.

Technical Solution

A copper based conductive paste according to an embodiment of the present inventive concept comprises a copolymer-copper composite comprising an imidazole-silane copolymer with partially cross-linked structure and a copper powder, a solvent, a binder and an additive. The imidazole-silane copolymer with partially cross-linked structure is introduced into the copper powder whose surface is treated by a hydrochloric acid aqueous solution and a phosphoric acid aqueous solution, and the imidazole-silane copolymer is polymerized by using an imidazole monomer represented by following formula 1, a silane monomer represented by following formula 2 and a cross-linking agent.

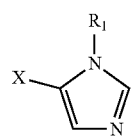

[Formula 1]

In Formula 1, X represents a hydrogen atom (H) or a methyl group (—CH$_3$), and R$_1$ represents a vinyl group or an allyl group.

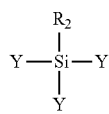

[Formula 2]

In Formula 2, Y represents a methoxy group, a 2-methoxy ethoxy group or an acetoxy group, and R$_2$ represents a vinyl group.

A copper based conductive paste's preparation method according to an embodiment of the present inventive concept comprises (a) preparing an imidazole-silane copolymer with partially cross-linked structure polymerized by using an imidazole monomer represented by following formula 1, a silane monomer represented by following formula 2 and a cross-linking agent;

(b) preparing a copolymer-copper composite by introducing the imidazole-silane copolymer into a copper powder whose surface is treated out by a hydrochloric acid aqueous solution and a phosphoric acid aqueous solution; and (c) preparing a conductive paste by mixing the copolymer-copper composite with a solvent, a binder and an additive.

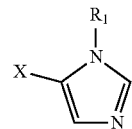

[Formula 1]

In Formula 1, X represents a hydrogen atom (H) or a methyl group (—CH$_3$), and R$_1$ represents a vinyl group or an allyl group.

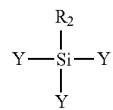

[Formula 2]

In Formula 2, Y represents a methoxy group, a 2-methoxy ethoxy group or an acetoxy group, and R$_2$ represents a vinyl group.

Advantageous Effects

A copper based conductive paste according to embodiments of the present inventive concept can have excellent properties. For example, the copper based conductive paste can have excellent corrosion resistance and heat resistance.

The copper based conductive paste's preparation method according to the present inventive concept is a completely new method which has never been reported among copper pastes based on oil-based and water-based binder. According to this preparation method, a copolymer-copper composite can be prepared by using a imidazole-silane copolymer in which a cross-linking agent is introduced to form an anti-corrosive layer on the surface of a copper powder, and a copper based conductive paste with corrosion resistance and heat resistance can be prepared by mixing the copolymer-copper composite with an additive and a binder resin dissolved in a solvent.

In addition, the copper based conductive paste prepared by the present inventive concept is a copper paste that does not require any heat treatment and curing process, and has the advantage that it is possible to use copper powders with relatively high price competitiveness and mass-produce copper pastes with corrosion resistance and heat resistance.

DETAILED DESCRIPTION OF THE DRAWINGS

FIG. 1 is a flowchart illustrating a copper paste's preparation method according to one embodiment of the present inventive concept.

Figure 2:
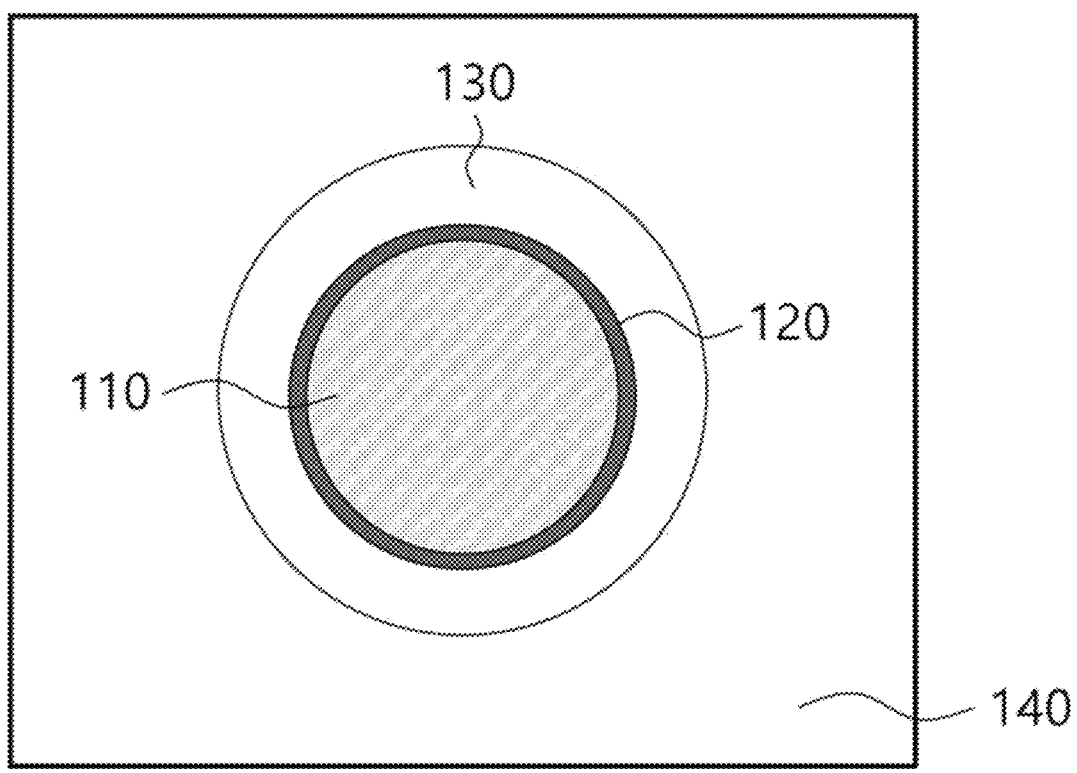

FIG. 2 is a view schematically illustrating a sectional structure of a copper based conductive paste according to one embodiment of the present inventive concept where the copper based conductive is prepared by adding an imidazole-silane copolymer with partially cross-linked structure to a copper powder whose surface is treated by a hydrochloric acid aqueous solution and a phosphoric acid aqueous solution to form a copolymer-copper composite and mixing it with a solvent containing a binder.

DETAILED DESCRIPTION

Hereinafter, a detailed description will be given of the present inventive concept with reference to the following embodiments. The purposes, features, and advantages of the present inventive concept will be easily understood through the following embodiments. The present inventive concept is not limited to such embodiments, but may be modified in other forms. The embodiments to be described below are nothing but the ones provided to bring the disclosure of the present inventive concept to perfection and assist those skilled in the art to completely understand the present inventive concept. Therefore, the following embodiments are not to be construed as limiting the present inventive concept.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

It will be understood that when an element is referred to as being "on" another element, it can be directly on the other element or intervening elements may be present therebetween. In contrast, when an element is referred to as being "directly on" another element, there are no intervening elements present.

The size of the element or the relative sizes between elements in the drawings may be shown to be exaggerated for more clear understanding of the present inventive concept. In addition, the shape of the elements shown in the drawings may be somewhat changed by variation of the manufacturing process or the like. Accordingly, the embodiments disclosed herein are not to be limited to the shapes shown in the drawings unless otherwise stated, and it is to be understood to include a certain amount of variation.

Unless otherwise specified herein, numerical range such as time, temperature, content, size and the like means the range that can optimize the preparation method of the present inventive concept.

A copper based conductive paste according to embodiments of the present inventive concept comprises a copolymer-copper composite comprising an imidazole-silane copolymer with partially cross-linked structure and a copper powder, a solvent, a binder and an additive. The imidazole-silane copolymer with partially cross-linked structure is introduced into the copper powder whose surface is treated by a hydrochloric acid aqueous solution and a phosphoric acid aqueous solution. The imidazole-silane copolymer is polymerized by using an imidazole monomer represented by following formula 1, a silane monomer represented by following formula 2 and a cross-linking agent.

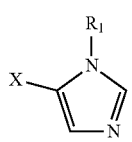

[Formula 1]

In Formula 1, X represents a hydrogen atom (H) or a methyl group (—CH$_3$), and R$_1$ represents a vinyl group or an allyl group.

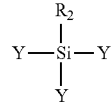

[Formula 2]

In Formula 2, Y represents a methoxy group, a 2-methoxy ethoxy group or an acetoxy group, and R$_2$ represents a vinyl group.

The silane monomer may be 1 to 30 parts by weight with respect to 100 parts by weight of the imidazole monomer.

Divinylbenzene may be used as the cross-linking agent.

The cross-linking agent may be 1 to 20 parts by weight with respect to 200 parts by weight of a sum of the imidazole monomer and the silane monomer.

The copper powder may be one of spherical, flake, needle-shaped, fiber and dendrite forms with an average particle diameter of 1 to 10 micrometers.

The hydrochloric acid aqueous solution and the phosphoric acid aqueous solution may be introduced simultaneously when treating the surface of the copper powder.

A concentration of the hydrochloric acid aqueous solution may be 0.5 M (Molar concentration) to 2 M. A volume of the hydrochloric acid aqueous solution may be 3 to 10 milliliters with respect to 10 grams of the copper powder.

A concentration of the phosphoric acid aqueous solution may be 1 M (Molar concentration) to 2.5 M. A volume of the phosphoric acid aqueous solution may be 1 to 5 milliliters with respect to 10 grams of the copper powder.

The imidazole-silane copolymer may be 2 to 10 parts by weight with respect to 100 parts by weight of the copper powder.

The binder may be a water-based binder or an oil-based binder. The water-based binder may comprise at least one of polystyrene sulfonate, polyvinyl alcohol, hydroxylmethyl cellulose, hydroxylpropyl cellulose, hydroxylpropylmethyl cellulose, carboxymethyl cellulose and carboxypropyl cellulose. The oil-based binder may comprise at least one of ethylcellulose, ethylene glycol butyl ether, hydroxyethyl cellulose, ethyl hydroxyethyl cellulose, methylcellulose and nitrocellulose. The water-based binder or the oil-based binder may be 3 to 30 parts by weight with respect to 100 parts by weight of the copolymer-copper composite.

The solvent may be a water-based solvent or an oil-based solvent. The water-based solvent may be deionized distilled water. The oil-based solvent may comprise at least one of diethylene glycol monobutyl ether, diethylene glycol dibutyl ether, diethylene glycol monobutyl ether acetate, α-terpinol, β-terpinol, butyl carbitol acetate and carbitol acetate. The water-based solvent or the oil-based solvent may be 15 to 60 parts by weight with respect to 100 parts by weight of the copolymer-copper composite.

The additive may comprise at least one of a chain extender, a film impact reliever, a drying retarder, a dispersant and an adhesion promoter.

The chain extender may comprise at least one of divinyl sulfone, 1,3-propanediol, 1,4-butanediol, diglycidyl ether, 1,6-hexanediol, cyclohexanedimethanol, hydroquinone bis (2-hydroxyether)ether, neopentyl glycol, 1,4-cyclohexanedimethane, ethanolamine, diethanolamine, triethanolamine, dimethylthiotoluenediamine and diethyltoluenediamine The film impact reliever may comprise polyvinylpyrrolidone.

The drying retarder may comprise at least one of ethylene glycol, diethylene glycol, propylene glycol and dipropylene glycol.

The dispersant may comprise at least one of an anionic surfactant, a cationic surfactant, a both-sided surfactant and a nonionic surfactant.

The adhesion promoter may comprise at least one of glycidoxypropyltrimethoxysilane, methacryloxypropyltrimethoxysilane, vinyltrimethoxysilane, vinyltriethoxysilane and vinyltriacetoxysilane.

Each of the chain extender, the film impact reliever, the drying retarder, the dispersant and the adhesion promoter may be 0.01 to 10 parts by weight with respect to 200 parts by weight of the solvent containing the binder.

A copper based conductive paste's preparation method according to an embodiment of the present inventive concept comprises (a) preparing an imidazole-silane copolymer with partially cross-linked structure polymerized by using an imidazole monomer represented by following formula 1, a silane monomer represented by following formula 2 and a cross-linking agent, (b) preparing a copolymer-copper composite by introducing the imidazole-silane copolymer into a copper powder whose surface is treated by a hydrochloric acid aqueous solution and a phosphoric acid aqueous solution, and (c) preparing a conductive paste by mixing the copolymer-copper composite with a solvent, a binder and an additive.

[Formula 1]

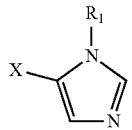

In Formula 1, X represents a hydrogen atom (H) or a methyl group (—$CH_3$), and $R_1$ represents a vinyl group or an allyl group.

[Formula 2]

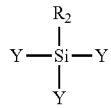

In Formula 2, Y represents a methoxy group, a 2-methoxy ethoxy group or an acetoxy group, and $R_2$ represents a vinyl group.

The silane monomer may be 1 to 30 parts by weight with respect to 100 parts by weight of the imidazole monomer.

Divinylbenzene may be used as the cross-linking agent.

The cross-linking agent may be 1 to 20 parts by weight with respect to 200 parts by weight of a sum of the imidazole monomer and the silane monomer.

The copper powder may be one of spherical, flake, needle-shaped, fiber and dendrite forms with an average particle diameter of 1 to 10 micrometers.

The hydrochloric acid aqueous solution and the phosphoric acid aqueous solution may be introduced simultaneously when treating the surface of the copper powder.

A concentration of the hydrochloric acid aqueous solution may be 0.5 M (Molar concentration) to 2 M. A volume of the hydrochloric acid aqueous solution may be 3 to 10 milliliters with respect to 10 grams of the copper powder.

A concentration of the phosphoric acid aqueous solution may be 1 M (Molar concentration) to 2.5 M. A volume of the phosphoric acid aqueous solution may be 1 to 5 milliliters with respect to 10 grams of the copper powder.

The imidazole-silane copolymer may be 2 to 10 parts by weight with respect to 100 parts by weight of the copper powder.

The binder may be a water-based binder or an oil-based binder. The water-based binder may comprise at least one of polystyrene sulfonate, polyvinyl alcohol, hydroxylmethyl cellulose, hydroxylpropyl cellulose, hydroxylpropylmethyl cellulose, carboxymethyl cellulose and carboxypropyl cellulose. The oil-based binder may comprise at least one of ethylcellulose, ethylene glycol butyl ether, hydroxyethyl cellulose, ethyl hydroxyethyl cellulose, methylcellulose and nitrocellulose. The water-based binder or the oil-based binder may be 3 to 30 parts by weight with respect to 100 parts by weight of the copolymer-copper composite.

The solvent may be a water-based solvent or an oil-based solvent. The water-based solvent may be deionized distilled water. The oil-based solvent may comprise at least one of diethylene glycol monobutyl ether, diethylene glycol dibutyl ether, diethylene glycol monobutyl ether acetate, α-terpinol, β-terpinol, butyl carbitol acetate and carbitol acetate. The water-based solvent or the oil-based solvent may be 15 to 60 parts by weight with respect to 100 parts by weight of the copolymer-copper composite.

The additive may comprise at least one of a chain extender, a film impact reliever, a drying retarder, a dispersant and an adhesion promoter.

The chain extender may comprise at least one of divinyl sulfone, 1,3-propanediol, 1,4-butanediol, diglycidyl ether, 1,6-hexanediol, cyclohexanedimethanol, hydroquinone bis (2-hydroxyether)ether, neopentyl glycol, 1,4-cyclohexanedimethane, ethanolamine, diethanolamine, triethanolamine, dimethylthiotoluenediamine and diethyltoluenediamine.

The film impact reliever may comprise polyvinylpyrrolidone.

The drying retarder may comprise at least one of ethylene glycol, diethylene glycol, propylene glycol and dipropylene glycol.

The dispersant may comprise at least one of an anionic surfactant, a cationic surfactant, a both-sided surfactant and a nonionic surfactant.

The adhesion promoter may comprise at least one of glycidoxypropyltrimethoxysilane, methacryloxypropyltrimethoxysilane, vinyltrimethoxysilane, vinyltriethoxysilane and vinyltriacetoxysilane.

Each of the chain extender, the film impact reliever, the drying retarder, the dispersant and the adhesion promoter may be 0.01 to 10 parts by weight with respect to 200 parts by weight of the solvent containing the binder.

In the present inventive concept, in order to obtain a copper based conductive paste with excellent corrosion resistance, various imidazole-silane copolymers are used in place of one kind of imidazole-silane copolymer.

In step (a), monomers used to prepare an imidazole-silane copolymer with partially cross-linked structure are an imidazole monomer represented by following formula 1 and a silane monomer represented by following formula 2.

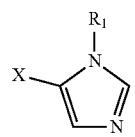

[Formula 1]

X represents a hydrogen atom (H) or a methyl group (—CH$_3$), and R$_1$ represents a vinyl group or an allyl group.

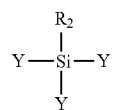

[Formula 2]

Y represents a methoxy group, a 2-methoxy ethoxy group or an acetoxy group, and R$_2$ represents a vinyl group.

Formula 1 represents a polymerizable imidazole compound, wherein X represents a hydrogen atom or a methyl group. R$_1$ represents a vinyl group or an allyl group, and these functional groups are polymerizable.

Formula 2 represents a polymerizable silane compound, and a silane coupling agent is preferable but this is not limited to it. Herein, Y represents methoxy group, 2-methoxy ethoxy group or acetoxy group, and generates a hydroxy group (—OH) in the silane coupling agent during the hydrolysis process. Y forms a byproduct in the form of alcohol. The hydroxy group (—OH) formed on silane contributes to enhance the adhesion of the copolymer by a condensation reaction. R$_2$ represents vinyl, and this vinyl group can be polymerized with R$_1$ of formula 1 to play a part in forming a copolymer. As the monomers used in preparing the imidazole-silane copolymer with partially cross-linked structure, vinylimidazole and vinyltrimethoxysilane are preferable but the monomers are not limited to them. The copper based conductive paste and its preparation method specified in the following steps can be applied to various imidazole-silane copolymers mentioned above.

The property of a high molecule varies greatly depending on variables such as molecular weight, stereochemical structure, degree of cross-linking, arrangement of repeating units and so on, and the range of their use also varies. Thus, the inventor of the present inventive concept uses divinylbenzene as a cross-linking agent to polymerize an imidazole-vinyl copolymer with partially cross-linked structure in place of the existing polymerization of a copolymer. In addition, a number of studies have been carried out in order to prepare an imidazole-silane copolymer with partially cross-linked structure that is the most suitable for copper based conductive pastes, and optimum reaction conditions have been found to be disclosed. In step (a), when preparing the vinylimidazole-silane copolymer with partially cross-linked structure, it is preferable that vinylimidazole is 10 to 30 parts by weight with respect to 1 part by weight of vinyltrimethoxysilane. In the vinylimidazole-silane copolymer with partially cross-linked structure, the vinylimidazole gives the copolymer heat resistance and silane provides an adhesive force that allows to coat the copolymer on the copper surface. When vinylimidazole is less than 10 parts by weight with respect to 1 part by weight of vinyltrimethoxysilane, the imidazole proportion in the vinylimidazole-silane copolymer with partially cross-linked structure is low to lower heat resistance. When vinylimidazole is greater than 30 parts by weight with respect to 1 part by weight of vinyltrimethoxysilane, the silane proportion in the vinylimidazole-silane copolymer with partially cross-linked structure is low, and thus it is difficult to coat the vinylimidazole-silane copolymer on the surface of the copper powder.

As a cross-linking agent used in preparing the vinylimidazole-silane copolymer with partially cross-linked structure in step (a), divinylbenzene is preferable but its kind is not limited. If partially cross-linked structure is formed by introducing a cross-linking agent when preparing the copolymer, the disadvantage of the vinylimidazole-silane copolymer that it is vulnerable to moisture can be remedied. When the vinylimidazole-silane copolymer with partially cross-linked structure is prepared, it is preferable that the cross-linking agent is 1 to 20 parts by weight with respect to 200 parts by weight of the monomer. When the cross-linking agent is less than 1 part by weight with respect to 200 parts by weight of the monomer, the cross-linking structure is not formed properly so that there is the disadvantage that it is vulnerable to moisture. When the cross-linking agent is greater than 20 parts by weight with respect to 200 parts by weight of the monomer, the cross-linking structure increases so that there is the disadvantage that it is difficult to use the copolymer for the coating of the copper surface.

It is preferable that the copper powder used in step (b) is in the form of flake and has a diameter of 5 to 50 micrometers, but is not limited thereto.

In step (b), a single process in which the acid treatment of the copper powder is carried out simultaneously with hydrochloric acid aqueous solution and phosphoric acid aqueous solution is proposed. This is to generate a new bonding functional group by carrying out the acid treatment on the surface of the copper particles in order to effectively bond various imidazole-silane copolymers to the copper surface. In the conventional surface treatment method, when the surface treatment of the copper powder is carried out with hydrochloric acid aqueous solution and phosphoric acid aqueous solution of (b), in general, the hydrochloric acid aqueous solution is first introduced into the copper powder under the inert gas injection to etch the surface of the copper powder. After that, the phosphoric acid aqueous solution is introduced additionally to form copper phosphate. In this stepwise copper surface treatment method, the surface of the copper powder is treated stage by stage so that the surface treatment time is long and the waste solution resulting from the surface treatment is also increased. In addition, since the surface treatment of copper is carried out with a hydrochloric acid aqueous solution under an inert gas, it is necessary to control experimental apparatus and surrounding environment in order to create an inert environment. In the present inventive concept, in order to solve these disadvantages, when the surface treatment of the copper powder carried out with hydrochloric acid aqueous solution and phosphoric acid aqueous solution, both solutions are simultaneously introduced to attempt surface etching of the copper powder and copper phosphate formation at the same time. As a result, the surface treatment time of the copper powder is drastically shortened and the amount of the waste solution is decreased. Also, since the surface treatment of the copper powder is carried out at atmospheric pressure and room temperature in the atmosphere, there is the advantage that complicated experimental equipment and detailed control of the environment around the reactor are not needed. It is preferable that the concentration of the hydrochloric acid aqueous solution added for the surface treatment of the copper powder is 0.5 M (Molar concentration) to 2 M, and the volume of the hydrochloric acid aqueous solution is 3 to 10 milliliters with respect to 10 grams of the copper powder. When the amount is less than 3 milliliters with respect to 10 grams of the copper powder, the surface of the copper powder is not effectively etched so that the oxide layer on the copper surface remains to lower the conductivity of the copper powder. When the amount is greater than 10 milliliters, the surface of the copper powder is excessively etched to cause weight loss of the copper powder.

It is preferable that the concentration of the phosphoric acid aqueous solution added for the surface treatment of the copper powder is 1 M (Molar concentration) to 2.5 M, and the volume of the added phosphoric acid aqueous solution is 1 to 5 milliliters with respect to 10 grams of the copper powder. When the amount is less than 1 milliliter with respect to 10 grams of copper powder, phosphate is not effectively formed on the copper surface and oxidation resistance is not generated so that the surface of the copper powder is easily oxidized to lower the conductivity of the copper. When the phosphoric acid aqueous solution is greater than 5 milliliters with respect to 10 grams of the copper powder, phosphate is excessively formed on the surface of the copper powder to lower the conductivity of the copper powder.

It is preferable that the vinylimidazole-silane copolymer with partially cross-linked structure used when preparing the copolymer-copper composite in step (b) is 2 to 10 parts by weight with respect to 100 parts by weight of the copper powder. When the vinylimidazole-silane copolymer with partially cross-linked structure is less than 2 parts by weight with respect to 100 parts by weight of the copper powder, the amount is insufficient to give corrosion resistance and heat resistance to the copper powder. When the vinylimidazole-silane copolymer with partially cross-linked structure exceeds 10 parts by weight, the proportion of nonconductor is increased to lower the conductivity of the copper based conductive paste.

The kind of the solvent used in preparing the conductive paste in step (c) is not heavily limited. It is preferable that the solvent in preparing the conductive paste is 15 to 60 parts by weight with respect to 100 parts by weight of the copolymer-copper complex. When the solvent is less than 15 parts by weight with respect to 100 parts by weight of the copolymer-copper complex, the viscosity of the conductive paste is too high to be easily printed so that the workability is poor. When the solvent exceeds 60 parts by weight, the viscosity of the conductive paste is so low that patterns spread and thus this is not desirable.

The kind of the binder used in preparing the conductive paste in step (c) is not heavily limited. It is preferable that the binder is 3 to 30 parts by weight with respect to 100 parts by weight of the copolymer-copper composite when preparing the conductive paste. When the binder is less than 3 parts by weight with respect to 100 parts by weight of the copolymer-copper composite, the cohesive force between copper powder particles is too strong to disperse them when turning into the paste. This causes problems in the printing of the copolymer-copper composite. When the binder exceeds 30 parts by weight with respect to 100 parts by weight of the copolymer-copper composite, the binder blocks the contact between the copper powder particles to hinder the formation of the conductive network. Accordingly, the conductivity of the conductive paste is lowered.

The present inventive concept is characterized in that a solvent, a binder and an additive are included. The present inventive concept discloses a high-performance copper based conductive paste realized not only as a water-based paste but also as an oil-based paste through a combination of various solvents, binders and additives.

Hereinafter, components of water-based and oil-based vehicles and additives in the copper based conductive paste of the present inventive concept will be described in detail separately.

A. Water-Based Vehicle Composition

The water-based vehicle included in the copper based conductive paste of the present inventive concept is a solution in which a water-based binder is dissolved in water that is a water-based solvent 1) Water-Based Binder As the water-based binder according to the present inventive concept, polystyrene sulfonate and polyvinyl alcohol that are a water-soluble polymer and water-dispersible cellulose with a hydrophilic group may be used. Examples of the water-soluble cellulose with a hydrophilic group include hydroxymethyl cellulose, hydroxypropyl cellulose, hydroxypropylmethyl cellulose, carboxymethyl cellulose, carboxypropyl cellulose. It is preferable that polystyrene sulfonate is used as the water-based binder.

It is preferable that the content of the water-based binder is 3 to 30 parts by weight with respect to 100 parts by weight of the copolymer-copper composite. When the content of the water-based binder is less than 3 parts by weight, the cohesive force between copper powder particles is too strong to disperse them when turning into the paste. This may cause problems in the printing of the copolymer-copper composite. When the content of the water-based binder exceeds 30 parts by weight, the content of the copper powder becomes relatively smaller than that of the water-based binder so that the water-based binder blocks the contact between the copper powder particles to hinder the formation of the conductive network. As a result, there is the disadvantage that the conductivity of the conductive paste is lowered.

2) Water-Based Solvent

As the water-based solvent according to the present inventive concept, water is used and deionized water is preferable. The preferable content of the water-based solvent is 15 to 60 parts by weight with respect to 100 parts by weight of the copolymer-copper complex. When the content of the water-based solvent is less than 15 parts by weight, the flowability of the copper paste becomes poor so that it may cause a problem in the dispersion of the copper paste in 3-roll mill dispersion process. When the content of the water-based solvent exceeds 60 parts by weight, the content of the copper powder becomes relatively small to lower the close contact between the copper powders. Accordingly, there is the disadvantage that the conductivity is lowered and the adhesiveness with a substrate is also lowered.

B. Oil-Based Vehicle Composition

The oil-based vehicle included in the copper based conductive paste of the present inventive concept is a solution in which an oil-based binder is dissolved in an oil-based solvent 1) Oil-Based Binder The oil-based binder according to the present inventive concept is a material that maintains flexibility in a wide temperature range. As the oil-based binder, cellulose-based resin, acrylate-based resin, polyvinyl butyral, polyester and the like may be used. In particular, it is preferable to use cellulose-based resin. Examples of the cellulose-based resin include methyl cellulose, ethyl cellulose, ethylhydroxy cellulose, hydroxyethyl cellulose, ethyl cellulose ether, ethylene glycol butyl ether, nitrocellulose and the like.

The preferable content of the oil-based binder is 3 to 30 parts by weight with respect to 100 parts by weight of the copolymer-copper composite. When the content of the oil-based binder is less than 3 parts by weight, the binder cannot envelop the copper powder due to insufficiency in binder content of the copper paste to lead to problems that the film formation of the copper paste is poor and the copper powders are exposed to the air to be easily oxidized. When the content of the oil-based binder exceeds 30 parts by weight, the content of the copper powder becomes relatively smaller than that of the binder to lead to a problem that the conductivity of the copper paste is lowered.

2) Oil-Based Solvent

The oil-based solvent used in the present inventive concept combines with the binder to generate viscosity suitable to the printing method. In the present inventive concept, it is preferable to use glycol ether, terpinol, carbitol acetate as an organic solvent. Examples of glycol ether include diethylene glycol monobutyl ether, diethylene glycol dibutyl ether, diethylene glycol monobutyl ether acetate and the like. Examples of terpinol include α-terpinol and β-terpinol. Examples of carbitol acetate include butyl carbitol acetate and carbitol acetate.

The amount of the oil-based solvent of the present inventive concept may be changed according to the used printing method. However, in general, the preferable content of the oil-based solvent is 15 to 60 parts by weight with respect to 100 parts by weight of the copolymer-copper complex. When the content of the oil-based solvent is less than 15 parts by weight, the flowability of the copper paste becomes poor so that it may cause a problem in the dispersion of the copper paste in the 3-roll mill dispersion process. When the content of the oil-based solvent exceeds 60 parts by weight, the content of the copper powder becomes relatively small to lower the close contact between the copper powders and thus there is the disadvantage that the conductivity is lowered and the adhesiveness with the substrate is also lowered.

C. Additives

The additives included in the copper based conductive paste of the present inventive concept are a chain extender, a film impact reliever, a drying retarder, a dispersant and an adhesion promoter that are known to those skilled in the art. One or more of the additives may be additionally introduced in order to enhance the function of oil-based and water-based binders in the paste of the present inventive concept. It is preferable that the concentration of any one of the chain extender, the film impact reliever, the drying retarder, the dispersant and an adhesion promoter included in the copper based conductive paste is 0.01 to 10 parts by weight with respect to 200 parts by weight of the solvent containing the binder.

1) Chain Extender

The chain extender is a compound used to increase the molecular weight by an additional treatment on a high molecule material such as post polymerization. In the chain extension, the chain extender is combined with the reaction group existing at the end of the high molecule material to ultimately increase the molecular weight of the high molecule. Examples of the representative chain extender include divinyl sulfone, 1,3-propanediol, 1,4-butanediol, diglycidyl ether, 1,6-hexanediol, cyclohexanedimethanol, hydroquinone bis (2-hydroxyether) ether, neopentyl glycol, 1,4-cyclohexanedimethane, ethanolamine, diethanolamine, triethanolamine, dimethylthiotoluenediamine, diethyltoluenediamine and the like.

When a hydroxyl group (—OH) is present at the end group of the high molecule, divinyl sulfone that is a chain extender reacts with the hydroxyl group under acid conditions to form an ether bond and thus the high molecule chain is extended. The high molecule material whose chain is extended like this has an increased water resistance and an increased heat resistance in comparison to existing high molecule. It is preferable to use divinyl sulfone as the chain extender.

It is preferable that the chain extender is 1 to 10 parts by weight with respect to 200 parts by weight of the solvent containing the binder. When the chain extender is greater than 10 parts by weight with respect to 200 parts by weight of the solvent containing the binder, the viscosity is increased due to an increase in molecular weight of the binder so that the workability is deteriorated. When the content of the chain extender is less than 1 part by weight with respect to 200 parts by weight of the solvent containing the binder, the molecular weight of the binder is so low that it is easily dissolved in a solvent. The effect of enhancing the function of the water-based binder by the chain extender and the optimal content of the chain extender are described in detail in following Examples and Table 2.

2) Film Impact Reliever

The film impact reliever mitigates the brittleness of the binder to give flexibility so that the pattern is not broken when forming the pattern film. In addition, the film impact reliever improves the durability by giving adhesion between the binder and the substrate. It is preferable to use polyvinylpyrrolidone as the film impact reliever of the binder. It is preferable that the film impact reliever is 1 to 25 parts by weight with respect to 500 parts by weight of the solvent containing the binder. When the amount of the film impact reliever is greater than 25 parts by weight with respect to 500 parts by weight of the solvent containing the binder, the film strength of the binder is lowered and thus it is difficult to maintain the pattern shape properly. When the amount of the film impact reliever is less than 1 part by weight with respect to 500 parts by weight of the solvent containing the binder, there is the disadvantage that the produced pattern film is easily broken by an external force due to brittleness of the binder film.

3) Drying Retarder

When forming a screen printer or a roll-to-roll type film from the copper paste, in order to have sufficient working time in the air, a certain amount of a drying retarder is introduced into a solvent and thus the solvent evaporation of the copper paste can be delayed. As the drying retarder for the binder, ethylene glycol, diethylene glycol, propylene glycol and dipropylene glycol can be used, and it is preferable to use ethylene glycol. If the content of ethylene glycol introduced into the solvent is increased, the drying rate of the copper paste is slowed so that the working time required for the printing operation can be obtained.

It is preferable that the drying retarder is 1 to 10 parts by weight with respect to 200 parts by weight of the solvent containing the binder. When the content exceeds 10 parts by weight, the evaporation rate is slow to lower the workability. When the content is less than 1 part by weight, the evaporation rate of the copper paste is so high that sufficient working time in the application field cannot be obtained.

4) Dispersant

The dispersant gives function of making metal particles uniformly present in the binder without clumping together. Therefore, the dispersant plays a role in improving the dispersion with the binder when mixing the metal particles. In the case of a metal paste, the gap between the metal particles should be maintained at least 20 nanometers. When the gap between the particles is narrow, cohesion phenomenon occurs so that it affects the stability and fluidity of the paste and the physical property and appearance of the produced pattern film. When the metal particles are mixed with the binder resin dissolved in the solvent, an anionic surfactant, a cationic surfactant, a both-sided surfactant and a nonionic surfactant which are low molecular dispersants, are used as the dispersant. It is preferable that the dispersant used in the copper paste is an anionic surfactant. As the hydrophilic group of the anionic surfactant, there are three kinds of hydrophilic groups, carboxylic acid (—COOH), sulfuric acid ester (—$OSO_3H$) and sulfonic acid. The sulfonic acid surfactant of these three kinds is excellent in resistance to hydrolysis, salting out and hard water. It is preferable to use 4-dodecylbenzenesulfonic acid as the dispersant.

It is preferable that the dispersant is 1 to 100 parts by weight with respect to 5000 parts by weight of the solvent containing the binder. When the content exceeds 100 parts by weight with respect to 5000 parts by weight of the solvent containing the binder, the film strength of the binder is lowered. When the content is less than 1 part by weight with respect to 5000 parts by weight of the binder, there is the disadvantage that the dispersibility of the copper powder and other additives in the copper paste is deteriorated.

5) Adhesion Promoter

The adhesion promoter is a compound having a function of improving adhesion between a copper paste and a substrate, and a silane coupling agent is used as a typical adhesion promoter.

The silane coupling agent has two or more different reaction groups in the molecule and one is a reaction group (methoxy group, ethoxy group, etc.) chemically bonding with inorganic materials (glass, metal, sand, etc.) and the other is a reaction group (vinyl group, epoxy group, amino group, methacryl group, mercapto group, etc.) chemically bonding with organic materials (various synthetic resins). In general, the silane coupling agent serves as an intermediate for chemically linking organic and inorganic materials. It is preferable to use glycidoxypropyltrimethoxysilane as the adhesion promoter. It is preferable that the adhesion promoter is 1 to 100 parts by weight with respect to 5000 parts by weight of the solvent containing the binder. When the content exceeds 100 parts by weight with respect to 5000 parts by weight of the solvent containing the binder, the adhesive strength with the medium is lowered due to a large amount of the silane component. When the content is less than 1 part by weight with respect to 5000 parts by weight of the solvent containing the binder, there is the disadvantage that the adhesive performance of the binder cannot be improved due to the lack of the silane component.

Hereinafter, the configuration and effects of the present inventive concept will be described in more detail with reference to accompanying drawings.

FIG. 1 is a flowchart illustrating a copper paste's preparation method according to one embodiment of the present inventive concept.

A cross-linking agent is added to an imidazole monomer and a silane monomer to polymerize an imidazole-silane copolymer with partially cross-linked structure (S100). A copper powder is added to a hydrochloric acid aqueous solution and a phosphoric acid aqueous solution to be stirred (S110), and thus a copper powder with phosphate formed on its surface is prepared (S120). The partially cross-linked imidazole-silane copolymer prepared in the previous step is added to the copper powder whose surface is treated (S130), and thus a copolymer-copper composite is prepared (S140). A binder dissolved in a solvent and an additive are mixed in the copolymer-copper complex by a mixing machine (S150), and thus a copper based conductive paste is prepared (S160).

FIG. 2 is a view schematically illustrating a sectional structure of a copper based conductive paste according to one embodiment of the present inventive concept where the copper based conductive is prepared by adding an imidazole-silane copolymer with partially cross-linked structure to a copper powder whose surface is treated by a hydrochloric acid aqueous solution and a phosphoric acid aqueous solution to form a copolymer-copper composite and mixing it with a solvent containing a binder.

Referring to FIG. 2, a copolymer-copper composite comprises a copper powder 110, a copper-phosphate film 120 and a partially cross-linked copolymer layer 130.

The copper powder 110 may be one of spherical, flake, needle-shaped, fiber and dendrite forms with an average particle diameter of 1 to 10 micrometers. The copper-phosphate film 120 is disposed on the surface of the copper powder 110. The partially cross-linked copolymer layer 130 is disposed on the copper-phosphate film 120 and comprises an imidazole-silane copolymer with partially cross-linked structure. Since a detailed explanation on the imidazole-silane copolymer with has been provided above, its explanation is omitted here.

A copper based conductive paste 100 comprises the copolymer-copper composite and a solvent 140 containing a binder. The copper based conductive paste 100 may be prepared by mixing the copolymer-copper composite and the solvent 140 containing a binder.

The copper paste of the present inventive concept can be prepared as a copper paste by a mixing machine after simultaneously mixing the above-described components and additives in a copolymer-copper composite in which an imidazole-silane copolymer is introduced into a copper powder. The prepared copper paste can be manufactured into various conductive patterns through a printing method such as screen printing, roll-to-roll process, offset printing and the like, and these copper paste patterns can be utilized in electrical and electronic devices and wearable devices. These conductive patterns are excellent in water resistance, thermal stability, impact resistance, printing workability, pot life and the like. Further, these conductive patterns do not additionally require for a high temperature curing process. As a result, they can be applied to various fields of electrical and electronic devices. For example, they can be applied to electrode material, sensor transducer, electromagnetic shielding material, touch panel electrode material, smartphone electrode material, solar cell front electrode, PDP panel electrode, RFID tag antenna, electrostatic capacity type touch panel circuit, PCB paste through hole and the like. In the case of a wearable device, the copper paste of the present inventive concept can be applied to flexible electronic material, transparent screen material, smart glasses material, smart watch material, wireless sensor material, wrist wearable band apparatus material and the like.

In addition, in order to apply the copper based conductive paste to various printing technologies, there is a strong demand for a manufacturing method for fabricating a new conductive electrode where additional heat curing and ultraviolet curing processes have been eliminated.

Most of silver (Ag) pastes mostly used now are using heat curing type paste. The heat curing type paste has a problem of heat energy consumption due to curing process and drying process. In addition, it is necessary to improve working conditions resulting from the use of organic solvents. Accordingly, an eco-friendly and economical ultraviolet curing type paste has been developed in place of the heat curing type silver paste used in the past. In the case of the ultraviolet curing type paste, an ultraviolet curing type oligomer is used in place of the currently available heat curing type binder. Further, in order to give flow characteristics, a monofunctional monomer is added to prepare a conductive silver paste and form paste patterns. However, when the ultraviolet curing type paste is used, it is inconvenient to need additional ultraviolet curing device. In order to solve these disadvantages at one time, a high molecule completing a polymerization reaction is used as a binder material to remove an additional polymerization process that is needed when the monomer or the oligomer is used. As a result, a copper based conductive paste which does not need heat curing and ultraviolet curing processes can be prepared, and a conductive electrode can be easily manufactured using this conductive paste. If this new concept copper paste is developed as a product, many advantages are expected such as international competitiveness improvement of domestic conductive paste industry, reduction in cost, productivity increase and cost reduction for energy saving.

In addition, in the case of existing copper based conductive paste, patterning is carried out only on non-pliable materials such as a metal substrate due to poor property in coating film and weak adhesive property of coating film. Since the copper based paste of the present inventive concept has characteristics that a partially cross-linked imidazole-silane copolymer is used, and water-based and oil-based solvent, a binder and an additive are included, it shows enhanced properties and can replace existing pastes where coating films are easily broken due to brittleness. Therefore, it can be applied to wearable devices. Due to the characteristics of the wearable devices which is worn in the human body or in direct contact with the human body as an accessory or a garment, the wearable devices need sweat or water resistance. Inventors of the present inventive concept intend to invent a copper based conductive paste that meets these requirements and can be applied to various electrical and electronic devices and wearable devices.

Hereinafter, a detailed description of the present inventive concept will be given with reference to examples, and the purposes, features, and advantages of the present inventive concept will be easily understood by these examples. However, this is provided just for explanatory purpose in order to clarify the technical idea of the present inventive concept, and thus the scope of the present inventive concept is not limited to this.

Example 1-3 and Comparative Example 1
(Performance Evaluation of Copper Paste According to the Content of Cross-Linking Agent)

In these examples and comparative example, conductive particles that are in the form of flake and have an average particle diameter of 6 micrometers were used, polystyrene sulfonate resin was used as a binder resin, and deionized distilled water was used as a solvent.

The imidazole-silane copolymer was prepared as follows. Vinylimidazole and vinyltrimethoxysilane were distilled under vacuum conditions. Distilled vinylimidazole monomer and vinyltrimethoxysilane monomer were mixed in a weight ratio of 15:1, and a cross-linking agent, divinylbenzene was added in the amount of 1 part by weight with respect to 200 parts by weight of the monomer, and then an initiator, azobisisobutyronitrile (AIBN) was added in the amount of 1 part by weight with respect to 100 parts by weight of the monomer. As a result, vinylimidazole-silane copolymer with partially cross-linked structure could be prepared. At this time, the concentration of the monomer and the initiator in the mixed solution composed of the monomer, the cross-linking agent and the initiator was 1 M and 0.001 M, respectively. The condition for adding azobisisobutyronitrile (AIBN) was 68° C. under inert gas conditions. 10 grams of copper powders was prepared by being treated with 10 milliliters of 1 mol hydrochloric acid aqueous solution and 4 milliliters of 1.5 mol phosphoric acid aqueous solution. Then, 2 parts by weight of the vinylimidazole-silane copolymer with partially cross-linked structure with respect to 100 parts by weight of copper powder was added and stirred for 30 minutes to prepare a copolymer-copper composite. Copper based aqueous conductive paste could be prepared by adding 0.75 gram of distilled water as a solvent and 0.25 gram of polystyrene sulfonate as a binder to 2 grams of the prepared copolymer-copper complex and stirring them. By using the copper based water-based conductive paste prepared above, whether the copolymer-copper complex was formed was measured. The water resistance of the copper paste was also measured. The results are shown in Table 1 below.

TABLE 1

| Components | Example 1 | Example 2 | Example 3 | Comparative Example 1 |
|---|---|---|---|---|
| Vinylimidazole | 10.5 | 10.5 | 10.5 | 10.5 |
| Vinyltrimethoxy-silane | 0.7 | 0.7 | 0.7 | 0.7 |
| Divinylbenzene | 0.112 | 0.028 | 0.56 | — |
| Isopropyl alcohol | 31.4 | 31.4 | 31.4 | 31.4 |
| Initiator | 0.112 | 0.112 | 0.112 | 0.112 |
| Formation of the copolymer-copper complex | Excellent | Excellent | Poor | Excellent |
| Water resistance of the paste | Good | Insufficient | poor | Poor |

In the case of Example 1, cross-linking was introduced into the imidazole-silane copolymer, but the copolymer could be dissolved in ethanol, a solvent for treating the surface of copper with the copolymer. In addition, the formation of the copolymer-copper complex was excellent, and the water resistance to water was increased when preparing the copper paste so that the moisture stability of the copper paste could be improved. In contrast, in the case of Comparative Example 1, no cross-linking was introduced into the imidazole-silane copolymer and the formation of the copolymer-copper complex was excellent. In addition, the water resistance to water was poor when preparing the copper paste and thus it was observed that the imidazole-silane copolymer was dissolved when being in contact with water.

In the case of Example 2, cross-linking was introduced into the imidazole-silane copolymer, but its content was less than that of Example 1 and thus it was easily dissolved in ethanol, a solvent for treating the surface of copper with the copolymer. In addition, the formation of the copolymer-copper complex was excellent, but the water resistance to water was not increased when preparing the copper paste so that the moisture stability of the copper paste was poor.

In the case of Example 3, the content of the cross-linking agent was greater than that of Example 1 and thus the cross-linking density was increased in the imidazole-silane copolymer. Due to the high cross-linking density, the imidazole-silane copolymer was not dissolved in ethanol for treating the surface of copper so that it could not be properly coated on the copper surface and its state is too poor to form a copolymer-copper complex. Therefore, the copolymer was not coated on the surface of copper when preparing the copper paste so that the water resistance to water was poor. This shows that the water resistance of the paste is greatly affected by whether the cross-linking agent exists or not.

Further, examples in which the amount of divinylbenzene as the cross-linking agent was adjusted to 0.112, 0.028, and 0.56, show that it is difficult to prepare a copper based paste with excellent quality when the amount of the cross-linking agent is insufficient or excessive. Accordingly, the suitable amount of the cross-linking agent should be added in order to form the most optimal copolymer-copper complex and have the water resistance of the paste.

Examples 1-6 and Comparative Example 1
(Performance Evaluation of Copper Paste According to the Kind of Additives)

In these examples and comparative example, conductive particles that are in the form of flake and have an average particle diameter of 6 micrometers were used, polystyrene sulfonate resin was used as a binder resin, and deionized distilled water was used as a solvent.

The imidazole-silane copolymer was prepared as follows. Vinylimidazole and vinyltrimethoxysilane were distilled under vacuum conditions. Distilled vinylimidazole monomer and vinyltrimethoxysilane monomer were mixed in a weight ratio of 15:1, and then a cross-linking agent, divinylbenzene was added in an amount of 1 part by weight with respect to 200 parts by weight of the monomer, and then an initiator, azobisisobutyronitrile (AIBN) was added in an amount of 1 part by weight with respect to 100 parts by weight of the monomer. Thus, vinylimidazole-silane copolymer with partially cross-linked structure was prepared. At this time, the concentrations of the monomer and the initiator in the mixed solution composed of the monomer, the cross-linking agent and the initiator were 1 M and 0.001 M, respectively. The conditions for adding azobisisobutyronitrile (AIBN) were 68° C. under inert gas conditions. 10 grams of the copper powder was prepared by being treated with 10 milliliters of 1 mol hydrochloric acid aqueous solution and 4 milliliters of 1.5 mol phosphoric acid aqueous solution. Then, 2 parts by weight of the vinylimidazole-silane copolymer with partially cross-linked structure with respect to 100 parts by weight of the copper powder was added and stirred for 30 minutes to prepare a copolymer-copper composite. Copper based conductive paste could be prepared by adding 0.75 gram of distilled water as a solvent and 0.25 gram of polystyrene sulfonate as a binder to 2 grams of the prepared copolymer-copper complex and stirring them.

Divinylsulfone was used as a chain extender, one of additives. Polyvinylpyrrolidone was used as a film impact reliever. Ethylene glycol was used as a drying retarder. 4-dodecylbenzene sulfonic acid was used as a dispersant. Glycidoxypropyltrimethoxysilane was used as an adhesion promoter.

First, the copolymer-copper composite was added to a mixture solution of polystyrene sulfonate and distilled water to prepare a homogeneous mixture solution by hand mixing. Then, a certain amount of additives (a film impact reliever, a drying retarder, a dispersant and an adhesion promoter) was added to the homogeneous mixture solution, and the mixture was further stirred by hand mixing to prepare the copper paste. When adding the chain extender, 6 parts by weight of divinylsulfone with respect to 200 parts by weight of distilled water containing polystyrene sulfonate was added and stirred, and the heat treatment of the copper based conductive paste was carried out by heating at 70° C. for 60 minutes under atmospheric pressure conditions after coating the copper paste containing divinylsulfone on a cover glass.

In the case of Comparative Example 1, the introduction of the additives (chain extender, film impact reliever, dry retarder, dispersant and adhesion promoter) in the above Examples was omitted, and the preparation method was the same as that described above.

After coating the copper paste prepared as described above on a cover glass, water resistance, the property of the coating film, the ability of retarding dryness, dispersibility and adhesiveness of the coating film were measured. The results are shown in Table 2 below. (The amount of each item was written in grams)

TABLE 2

| Components | Example1 | Example2 | Example3 | Example4 | Example5 | Example6 | Comparative Example1 |
|---|---|---|---|---|---|---|---|
| Copolymer-copper composite | 400 | 400 | 400 | 400 | 400 | 400 | 400 |
| Binder resin | 50 | 50 | 50 | 50 | 50 | 50 | 50 |
| Solvent | 150 | 150 | 150 | 150 | 150 | 150 | 150 |
| Chain extender | 6 | — | 6 | 6 | 6 | 6 | — |
| Film impact reliever | 2 | 2 | — | 2 | 2 | 2 | — |
| Dry retarder | 6 | 6 | 6 | — | 6 | 6 | — |
| Dispersant | 0.2 | 0.2 | 0.2 | 0.2 | — | 0.2 | — |
| Adhesion promoter | 0.2 | 0.2 | 0.2 | 0.2 | 0.2 | — | — |
| Water resistance | good | poor | good | good | good | good | poor |
| Property of the coating film | good | good | poor | good | good | good | poor |
| Ability of retarding dryness | good | good | good | poor | good | good | poor |
| Dispersibility | excellent | excellent | good | good | poor | good | poor |
| Adhesiveness of the coating film | 100/100 | 100/100 | poor | 100/100 | poor | poor | poor |

As shown from the above results, the best copper paste characteristics were shown in Example 1 in terms of all aspects of water resistance, property of the coating film, ability of retarding dryness, dispersibility and adhesiveness of the coating film.

In the case of Example 2, film impact reliever, drying retarder, dispersant and adhesion promoter were added as additives. However, chain extender, divinyl sulfone was not added so that a chain extension of polystyrene sulfonate, the binder was not formed and thus the copper paste showed poor water resistance. Polystyrene sulfonate was in contact with water when forming the copper paste film, and the coated film was easily dissolved to limit the application range of the copper paste. Since other aspects of property of the coating film, ability of retarding dryness, dispersibility and adhesiveness of the coating film were excellent, copper paste characteristics were satisfactory.

In the case of Example 3, chain extender, drying retarder, dispersant and adhesion promoter were added to the copper paste as additives, but film impact reliever was not added. When the film impact reliever, polyvinylpyrrolidone was not added to the copper paste, the coating property of the film of the copper paste was poor and the adhesiveness of the coating film was also poor. This shows that the coating properties of the film of the copper paste are greatly affected by polyvinylpyrrolidone.

In the case of Example 4, chain extender, film impact reliever, dispersant and adhesion promoter were added to the copper paste as additives, but drying retarder was not added. Overall characteristics of the copper paste were good and satisfactory. However, when the drying retarder, ethylene glycol was not added to the copper paste, the disadvantage that the time available for the paste is short could not be overcome and the copper paste was hardened in a short time.

In the case of Example 5, chain extender, film impact reliever, drying retarder and adhesion promoter were added to the copper paste as additives, but dispersant was not added. When the dispersant, 4-dodecylbenzenesulfonic acid was not added to the copper paste, overall characteristics of the copper paste were satisfactory. However, the dispersion state of the copper powder in the paste is not good so that the dispersibility of the coating film and the adhesiveness of the coating film were poor.

In the case of Example 6, chain extender, film impact reliever, dispersant and drying retarder were added to the copper paste as additives, but the adhesion promoter, glycidoxypropyltrimethoxysilane was not added. In this case, overall characteristics of the copper paste film were satisfactory, but the adhesiveness of the coating film was poor.

In the case of Comparative Example 1, chain extender, film impact reliever, drying retarder, dispersant and adhesion promoter were not added as additives. When the chain extender, divinyl sulfone was not added, a chain extension of polystyrene sulfonate being a water-based binder was not formed and thus the water resistance of the copper paste was poor. In general, when forming a film using polystyrene sulfonate as a binder, the coating film is easily broken due to the brittleness. When the film impact reliever, polyvinylpyrrolidone was not added, the coating property of the film of the copper paste was poor. When ethylene glycol, the drying retarder compensating the disadvantage that the copper paste has a short available time was not added, the copper paste was hardened in a short time.

Further, when the dispersant, 4-dodecylbenzenesulfonic acid is not added to the copper paste, the dispersion of the copper powder in the paste is not good so that the dispersion state and the adhesiveness of the coating film were poor. When the adhesion promoter, glycidoxypropyltrimethoxysilane was not added to the copper paste, the adhesiveness of the coating film was poor.

Accordingly, the performance of Comparative Example 1 was so poor that it could not be commercialized, and many improvements are needed for actual use. The present inventive concept is not limited to the examples shown in Table 2, but includes constitutions regarding other water-based and oil-based solvents, binders and various additives.

Water resistance was evaluated by coating the copper paste on glass surface of 7.5 cm×2.5 cm, immersing it in water of 20±3° C., drying and weighing the amount of the coating film dissolved by water. When the coating film maintained its shape against water and weight loss was less than 5%, it was evaluated that water resistance is good. The property of the coating film was evaluated by coating a copper paste on a glass surface of 7.5 cm×2.5 cm and observing whether or not the coating film was formed by a microscope lens. Evaluation was made by considering whether or not there were irregularities on the surface of the copper paste and whether or not the coating film was formed. The ability of retarding dryness was evaluated by observing the flowability of the paste 2 hours after placing a sample with ethylene glycol in the copper paste and a sample without ethylene glycol in the copper paste in a constant temperature chamber of 20±3° C. with the naked eye. Regarding the dispersibility, the dispersibility state was checked by coating the copper paste on glass surface of 7.5 cm×2.5 cm and observing the microstructure of the paste through the microscope lens. The adhesiveness of the coating film was evaluated by ASTM D3359 using 3M Scotch tape 8-8890 according to Cross cut Test.

Although the embodiments of the present inventive concept have been disclosed for illustrative purposes, those skilled in the art will appreciate that the present inventive concept may be embodied in other specific ways without changing the technical spirit or essential features thereof. Therefore, the embodiments disclosed in the present inventive concept are not restrictive but are illustrative. The scope of the present inventive concept is given by the claims, rather than the specification, and also contains all modifications within the meaning and range equivalent to the claims.

INDUSTRIAL APPLICABILITY

According to the embodiments of the present inventive concept, it is possible to prepare a copper based conductive paste with excellent properties. The copper based conductive paste can have excellent corrosion resistance and heat resistance.

The invention claimed is:

1. A copper based conductive paste comprising:
a copolymer-copper composite comprising an imidazole-silane copolymer with a partially cross-linked structure and a copper powder;
a solvent;
a binder; and
an additive;
wherein the imidazole-silane copolymer with partially cross-linked structure is introduced into the copper powder whose surface is treated by a hydrochloric acid aqueous solution and a phosphoric acid aqueous solution, wherein the imidazole-silane copolymer is polymerized by using an imidazole monomer represented by formula 1, a silane monomer represented by formula 2 and a cross-linking agent

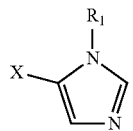

[Formula 1]

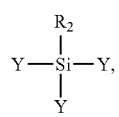

[Formula 2]

wherein X represents a hydrogen atom (H) or a methyl group (—$CH_3$), and $R_1$ represents a vinyl group or an allyl group, wherein Y represents a methoxy group, a 2-methoxy ethoxy group or an acetoxy group, and $R_2$ represents a vinyl group, and wherein the cross-linking agent is 1 to 20 parts by weight with respect to 200 parts by weight of a sum of the imidazole monomer and the silane monomer.

2. The copper based conductive paste of claim 1, wherein the silane monomer is 1 to 30 parts by weight with respect to 100 parts by weight of the imidazole monomer.

3. The copper based conductive paste of claim 1, wherein divinylbenzene is used as the cross-linking agent.

4. The copper based conductive paste of claim 1, wherein the copper powder is one of spherical, flake, needle-shaped, fiber and dendrite forms, with an average particle diameter of 1 to 10 micrometers.

5. The copper based conductive paste of claim 1, wherein the hydrochloric acid aqueous solution and the phosphoric acid aqueous solution are introduced simultaneously when treating the surface of the copper powder.

6. The copper based conductive paste of claim 1, wherein a concentration of the hydrochloric acid aqueous solution is 0.5 to 2 M.

7. The copper based conductive paste of claim 1, wherein a volume of the hydrochloric acid aqueous solution is 3 to 10 milliliters with respect to 10 grams of the copper powder.

8. The copper based conductive paste of claim 1, wherein a concentration of the phosphoric acid aqueous solution is 1 to 2.5 M.

9. The copper based conductive paste of claim 1, wherein a volume of the phosphoric acid aqueous solution is 1 to 5 milliliters with respect to 10 grams of the copper powder.

10. The copper based conductive paste of claim 1, wherein the imidazole-silane copolymer is 2 to 10 parts by weight with respect to 100 parts by weight of the copper powder.

11. The copper based conductive paste of claim 1, wherein the binder is a water-based binder or an oil-based binder.

12. The copper based conductive paste of claim 11, wherein the binder is the water-based binder and comprises at least one of polystyrene sulfonate, polyvinyl alcohol, hydroxylmethyl cellulose, hydroxylpropyl cellulose, hydroxylpropylmethyl cellulose, carboxymethyl cellulose and carboxypropyl cellulose.

13. The copper based conductive paste of claim 11, wherein the binder is the oil-based binder and comprises at least one of ethylcellulose, ethylene glycol butyl ether, hydroxyethyl cellulose, ethyl hydroxyethyl cellulose, methylcellulose and nitrocellulose.

14. The copper based conductive paste of claim 11, wherein the binder is 3 to 30 parts by weight with respect to 100 parts by weight of the copolymer-copper composite.

15. The copper based conductive paste of claim 1, wherein the solvent is a water-based solvent or an oil-based solvent.

16. The copper based conductive paste of claim 15, wherein the solvent is the water-based solvent and is deionized distilled water.

17. The copper based conductive paste of claim 15, wherein the solvent is the oil-based solvent and comprises at least one of diethylene glycol monobutyl ether, diethylene glycol dibutyl ether, diethylene glycol monobutyl ether acetate, α-terpinol, β-terpinol, butyl carbitol acetate and carbitol acetate.

18. The copper based conductive paste of claim 15, wherein the solvent is 15 to 60 parts by weight with respect to 100 parts by weight of the copolymer-copper composite.

19. The copper based conductive paste of claim 1, wherein the additive comprises at least one of a chain extender, a film impact reliever, a drying retarder, a dispersant or an adhesion promoter.

20. The copper based conductive paste of claim 19 wherein the additive comprises the chain extender, and wherein the chain extender comprises at least one of divinyl sulfone, 1,3-propanediol, 1,4-butanediol, diglycidyl ether, 1,6-hexanediol, cyclohexanedimethanol, hydroquinone bis (2-hydroxyether)ether, neopentyl glycol, 1,4-cyclohexanedimethane, ethanolamine, diethanolamine, triethanolamine, dimethylthiotoluenediamine and diethyltoluenediamine.

21. The copper based conductive paste of claim 19 wherein the additive comprises the film impact reliever, and wherein the film impact reliever comprises polyvinylpyrrolidone.

22. The copper based conductive paste of claim 19 wherein the additive comprises the drying retarder, and wherein the drying retarder comprises at least one of ethylene glycol, diethylene glycol, propylene glycol and dipropylene glycol.

23. The copper based conductive paste of claim 19, wherein the additive comprises the dispersant, and wherein the dispersant comprises at least one of an anionic surfactant, a cationic surfactant, a both-sided surfactant or a nonionic surfactant.

24. The copper based conductive paste of claim 19, wherein the additive comprises the adhesion promoter, and wherein the adhesion promoter comprises at least one of glycidoxypropyltrimethoxysilane, methacryloxypropyltrimethoxysilane, vinyltrimethoxysilane, vinyltriethoxysilane and vinyltriacetoxysilane.

25. The copper based conductive paste of claim 19, wherein each of the chain extender, the film impact reliever, the drying retarder, the dispersant and the adhesion promoter is 0.01 to 10 parts by weight with respect to 200 parts by weight of the solvent containing the binder.

26. A copper based conductive paste comprising:
a copolymer-copper composite;
a solvent;
a binder; and
an additive;

wherein the copolymer-copper composite comprises a copper powder, a copper-phosphate film disposed on the copper powder, and a copolymer layer disposed on the copper-phosphate film and comprising an imidazole-silane copolymer with a partially cross-linked structure, and the imidazole-silane copolymer is polymerized by using an imidazole monomer represented by formula 1, a silane monomer represented by formula 2 and a cross-linking agent

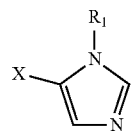

[Formula 1]

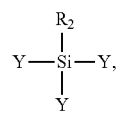

[Formula 2]

wherein X represents a hydrogen atom (H) or a methyl group (–CH$_3$), and R$_1$ represents a vinyl group or an allyl group, wherein Y represents a methoxy group, a 2-methoxy ethoxy group or an acetoxy group, and R$_2$ represents a vinyl group, and wherein the cross-linking agent is 1 to 20 parts by weight with respect to 200 parts by weight of a sum of the imidazole monomer and the silane monomer.

27. A device comprising the copper based conductive paste of claim 1.

* * * * *